(12) United States Patent
Russo

(10) Patent No.: US 6,258,446 B1
(45) Date of Patent: Jul. 10, 2001

(54) PRINTING MASKING SHEET AND MANUFACTURING METHOD THEREFOR

(76) Inventor: Daniel M. Russo, 1659 Pebblebeach Cir., Elgin, IL (US) 60123

( * ) Notice: Subject to any disclaimer, the term of this patent is extended or adjusted under 35 U.S.C. 154(b) by 0 days.

(21) Appl. No.: 08/570,539

(22) Filed: Dec. 11, 1995

Related U.S. Application Data

(60) Provisional application No. 60/000,136, filed on Jun. 12, 1995, now abandoned.

(51) Int. Cl.[7] ............................. B32B 27/14; B32B 3/00
(52) U.S. Cl. ..................... 428/195; 428/46; 428/411.1; 428/500
(58) Field of Search .................. 428/195, 411.1, 428/500, 46

(56) References Cited

U.S. PATENT DOCUMENTS

| | | |
|---|---|---|
| 1,777,144 | 9/1930 | Innes . |
| 2,972,533 | 2/1961 | Frankau et al. . |
| 3,169,063 | 2/1965 | Johnston et al. . |
| 3,499,377 | 3/1970 | Esses . |
| 3,591,284 | 7/1971 | Liebman . |
| 3,605,622 | 9/1971 | Zarip . |
| 3,615,474 | 10/1971 | Rosenberger . |
| 3,616,192 * | 10/1971 | Sinclair .................................. 428/13 |
| 3,659,353 | 5/1972 | D'Agrosa . |
| 3,769,895 | 11/1973 | Lucas . |
| 3,963,820 * | 6/1976 | Blakey .................................. 264/134 |
| 4,111,878 * | 9/1978 | Ruhf .................................... 260/29.6 |
| 4,409,305 | 10/1983 | Goetschi et al. . |

OTHER PUBLICATIONS

The Development of the Crosfield Magnascan 450, an enlarging Colour Scanner, Dr. W.P. L. Wilby and P.C. Puglsley, A paper given at the annual conference on Thursday Apr. 30, 1970.

* cited by examiner

Primary Examiner—William Krynski
(74) Attorney, Agent, or Firm—McAndrews, Held & Malloy, Ltd.

(57) ABSTRACT

A masking sheet for masking film work to be plated comprises a thin, generally rectangular sheet of material such as vinyl in a color, such as orange or red, which is opaque with respect to ultraviolet light. The masking sheet has a cross-hatched grid adhered to one face which is used to position and align film work on a light table.

9 Claims, 2 Drawing Sheets

PRINTING MASKING SHEET AND MANUFACTURING METHOD THEREFOR

CROSS-REFERENCE TO RELATED APPLICATIONS

This application claims the priority benefit of provisional application Ser. No. 60/000,136 filed Jun. 12, 1995, abandoned.

FIELD OF THE INVENTION

The present invention relates generally to a printing masking sheet and, more particularly, to a masking sheet comprising a grid preprinted on a sheet of polymeric material, such as vinyl, the sheet being a color which is opaque with respect to ultraviolet light.

BACKGROUND OF INVENTION

In the graphic arts industry, which encompasses the printing, lithographing, duplicating, publishing, advertising, commercial arts, and photoengraving fields, registration of film images is required before proceeding to the mechanics of producing the finished plates which are ultimately used for printing. Specifically, the various components which are to make up the resulting printed product must first be photographed and the resulting photographic images must then be positioned and assembled together to form a composite film negative image which is used to produce, i.e. "burn", the printing plate. This assembly process is referred to in the art as the masking or "stripping" step and is typically performed on a light table.

The masking or "stripping" of film work is performed by strippers who assemble, with precision, the various film components used to produce the composite proofs and burn the printing plates. The assembly mounting of these components is tedious work due to the necessity to precisely align and position the individual components.

Production stripping almost invariably includes the use of a masking sheet, commonly referred to as a flat, in a color which blocks the ultraviolet light used to burn the printing plate. The masking sheet is used to align and maintain the relative position of the various portions of the composite image and to control the portions of the image appearing on the printing plate. Specifically, the masking sheet and film images are placed on a light table, with the masking sheet overlying the film images. Although masking sheets block ultraviolet light, they are typically made of a material which is permeable by visible light so that the underlying film images are visible through the masking sheet when they are placed on a light table. The underlying film images are manipulated and positioned to achieve the desired composite image, at which point they are affixed to the underside of the masking sheet by an adhesive material such as, for example, adhesive tape. The masking sheet is then selectively cut away to expose the portions of the composite image which are to appear on the printing plate. The entire assembly, i.e. the masking sheet and the affixed composite image, is then transferred to a plate making machine where it is used to burn the printing plate.

In the past, masking sheets have typically been formed of either paper, coated or uncoated, or a vinyl, known in the art as printer's vinyl. These sheets are produced in a color (either orange or red in vinyl, or orange, red or goldenrod in paper), which masks the range of ultraviolet light produced by the plate burner.

Paper masking sheets are advantageous because they are often provided with preprinted grids which the stripper can use to align the film images before burning the plates. Paper masking sheets do, however, suffer from several drawbacks which make them unsatisfactory in many applications. Paper masking sheets are particularly problematic because they are not durable. Specifically, masking sheets typically include a border which is outside the image area, i.e., an area equal to the usable space on the resulting printing plate. Registration holes may be formed in this border and used in conjunction with registration pins to maintain alignment of the masking sheet and film images both during the stripping and plate burning processes. However, when paper masking sheets are employed, the registration holes are easily torn or deformed, making alignment of the film images difficult and imprecise. Paper masking sheets are also unsuitable for accurately reproducing duplicate printing plates at a later date because the paper can be deformed by shrinking and/or expansion due to temperature and/or humidity changes.

Vinyl masking sheets overcome the above noted problems with paper masking sheets. However, to date, preruled vinyl masking sheets are not commercially available. As a result, strippers are forced to manually rule the vinyl, e.g., with a pencil and a ruler. These manually ruled grids are invariably inaccurate, time consuming to construct, and are often smudged by use or storage because of the difficulty of permanently marking vinyl from which masking sheets are made.

Hence, there is a need to provide a preruled printing masking sheet which is constructed from a material which overcomes the deficiencies associated with paper masking sheets.

Accordingly, an object of the present invention is to provide a preruled printing masking sheet which is durable and precise.

Another object of the present invention is to provide a printing masking sheet which can be reliably reused to produce printing plates over an extended period of time.

Still another object of the present invention is to provide a printing masking sheet which is economical and simple to manufacture.

SUMMARY OF THE INVENTION

The above and other objects and advantages are provided by a printing masking sheet comprising a sheet of polymeric material, such as vinyl, in a color which is opaque with respect to ultraviolet light and which includes a grid preprinted on at least one face of the material. The material is preferably orange or red in color. The grid is preferably printed on an offset printing press and comprises a series of horizontal and vertical lines at regularly spaced intervals, such as, for example, $\frac{1}{8}$" apart. The masking sheet could, however, be printed using other processes, such as silk-screening or web-offset (roll) printing, and the grid could take numerous other patterns and spacings, such as $\frac{1}{2}$", $\frac{1}{4}$", $\frac{1}{16}$" or $\frac{1}{32}$".

DETAILED DESCRIPTION OF THE PREFERRED EMBODIMENTS

In the following detailed description, spatially orienting terms are used such as "left", "right", "vertical", "horizontal", "upper", "lower", and the like. It is to be understood that these terms are used for convenience of description of the preferred embodiments by reference to the drawings. These terms do not necessarily describe the absolute location or orientation in space, such as left, right, upward, downward, etc., that any part must assume.

Figure 1:
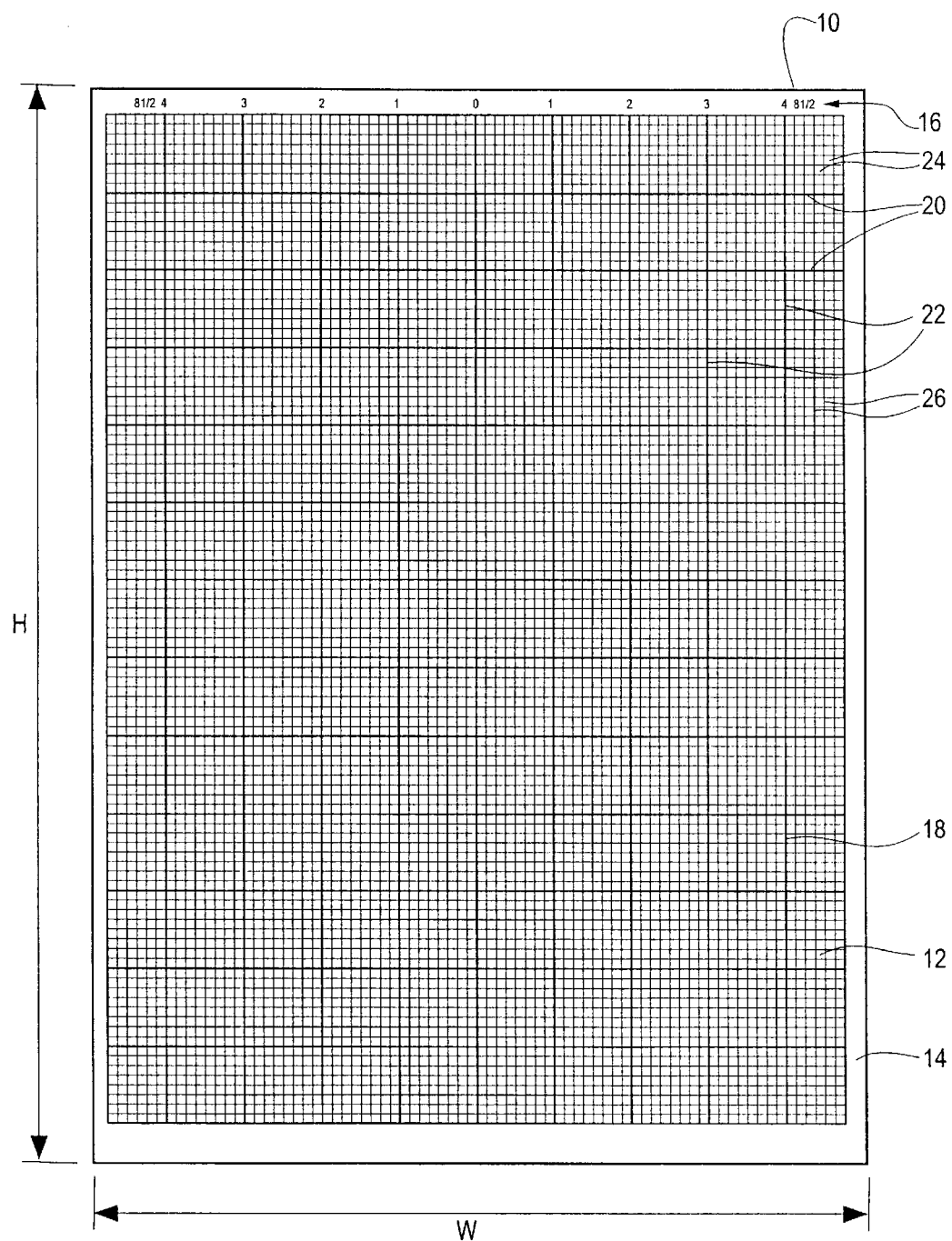
FIG. 1 is plan view of a masking sheet in accordance with the present invention.

Referring now to FIG. 1 the masking sheet comprises a thin, generally rectangular sheet of a durable material which is preferably a polymeric material. A suitable material is vinyl having a thickness of between 5.5 to 7.0 mils. The masking sheet has a color which is opaque over the spectrum of ultraviolet light produced by the plate burning machine. Suitable colors are red or orange. A particularly well suited vinyl is commercially known as "printer's grade" orange masking vinyl ("OMV") and is available from numerous suppliers manufacturers. One such product is Boltaron or Boltamask 4004-5012 as sold by GenCorp Polymer Products of Newcomerstown, Ohio.

The masking sheet 10 has a height and a width which generally correspond to the height (H) and width (W) of the printing plate which the masking sheet is used to produce. For example, a masking sheet used to produce a printing plate having a height of 18" and a width of 11" has a corresponding height of 18" and a width of 11".

The masking sheet 10 includes an image area 12 and a border 14 extending along at least one side of the image area. The image area 12 corresponds in size and shape to the maximum usable area on the printing plate. The border 14 generally corresponds in size and shape to the unusable area in the printing plate, i.e. the gripper portion of the printing plate. In the illustrated embodiment, the border 14 extends around all sides of the image area. The border 14 may be used to carry an index 16 and also provides a space to punch in which registration holes may be formed for receiving reciprocal registration pins.

The image area 12 includes a cross-hatched grid 18 which is preprinted on one face of the masking sheet 10. The grid 18 is preferably printed with a relatively quick drying ink which readily adheres to the masking sheet material. One such relatively quick drying ink is a rubber based ink such as Pro-Dry Ink which is commercially available from the Pro-Line Printing Ink Corp. of Phoenix, Ariz. Another such relatively quick drying ink is an oil based ink which may be obtained from Cardinal Colors Inc. of Chicago Ill.

The grid 18 comprises a first set of horizontal lines 20 and a first set of vertical lines 22 which divide the image area 12 into a plurality of 1 inch squares. Each of these squares is further subdivided into a plurality of smaller squares by a second set of horizontal lines 24 and a second set of vertical lines 26. Preferably the second sets of lines are space at 1/8th inch intervals. The masking sheet shown by FIG. 1 includes fourteen horizontal lines 20 in the first set and nine vertical lines 22 in the first set. It should be appreciated, however, that these numbers are a function of the plate size. The lines 20, 22 in the first sets are darker than those in the lines 24, 26 in the second sets so that they can be quickly located by the stripper.

The process of manufacturing the masking sheet 10 will now be explained in greater detail. Initially, masters of the various masking sheet components, i.e. the grid 18 and index 16, are constructed, either manually or via a computer drafting package. Preferably, the master is a mirror image of the masking sheet which is to be ultimately printed and it includes both the index 16 and the grided image area 12. As will be appreciated, however, the grid 18 and index 16 may be separately formed at this stage.

Film images (negative or positive) of the various components which are to appear in the printed masking sheet are then prepared using a camera. The film image(s) is(are) then assembled on a light table to construct the composite proof. Once the film negative image is assembled and proofed, the assembled image is transferred to the plate burner where it is used to create, i.e. "burn", a printing plate in a plate making machine.

The resulting plate is then positioned in a sheet fed offset printing press where it is used to print the image on the polymeric sheets. Using a sheet fed offset printing press is advantageous over a roll printer because the printed image is more likely to smear if a roll printer is used. Additionally, a sheet fed offset press is preferable because it is a relatively high speed printing press that can print a masking sheet quickly and therefore more economically than slower presses. It should be appreciated, however, that other printing processes, such as silk-screening or web-offset, could be used to print the masking sheets 10.

To produce and acceptable masking sheet, the printing press must print the grid so that it is accurately positioned on the masking sheet. The grid must be both straight and square on the vinyl sheet so that the grid is accurately positioned with respect to grippers or registration holes engaging the border of the sheet.

Vinyl is a difficult material on which to print. Selection of the ink which is used to form the grid on a vinyl sheet is critical to manufacturing an acceptable masking sheet. The ink must be selected specifically to durably adhere to vinyl and for use with the printing press which will print the grid on the vinyl. For example, the rubber based ink identified above has been found to work well with a Hamada Model 880 offset press. The oil based ink identified above has been found to work well with larger presses such as a 29" Harris press, Man Roland press, Ryobi press, ATF Chief press, etc.

In order to provide the border 14 on the masking sheet 10, the masking sheets must be printed on a press having a larger sheet size than that of the press on which the masking sheets are to be ultimately used. For example, a Hamada Model 880 which has 15½"×20½" plate offset press may be used to manufacture masking sheets for use on an AB Dick 360 which has an 18½"×11½" plate.

Figure 2:
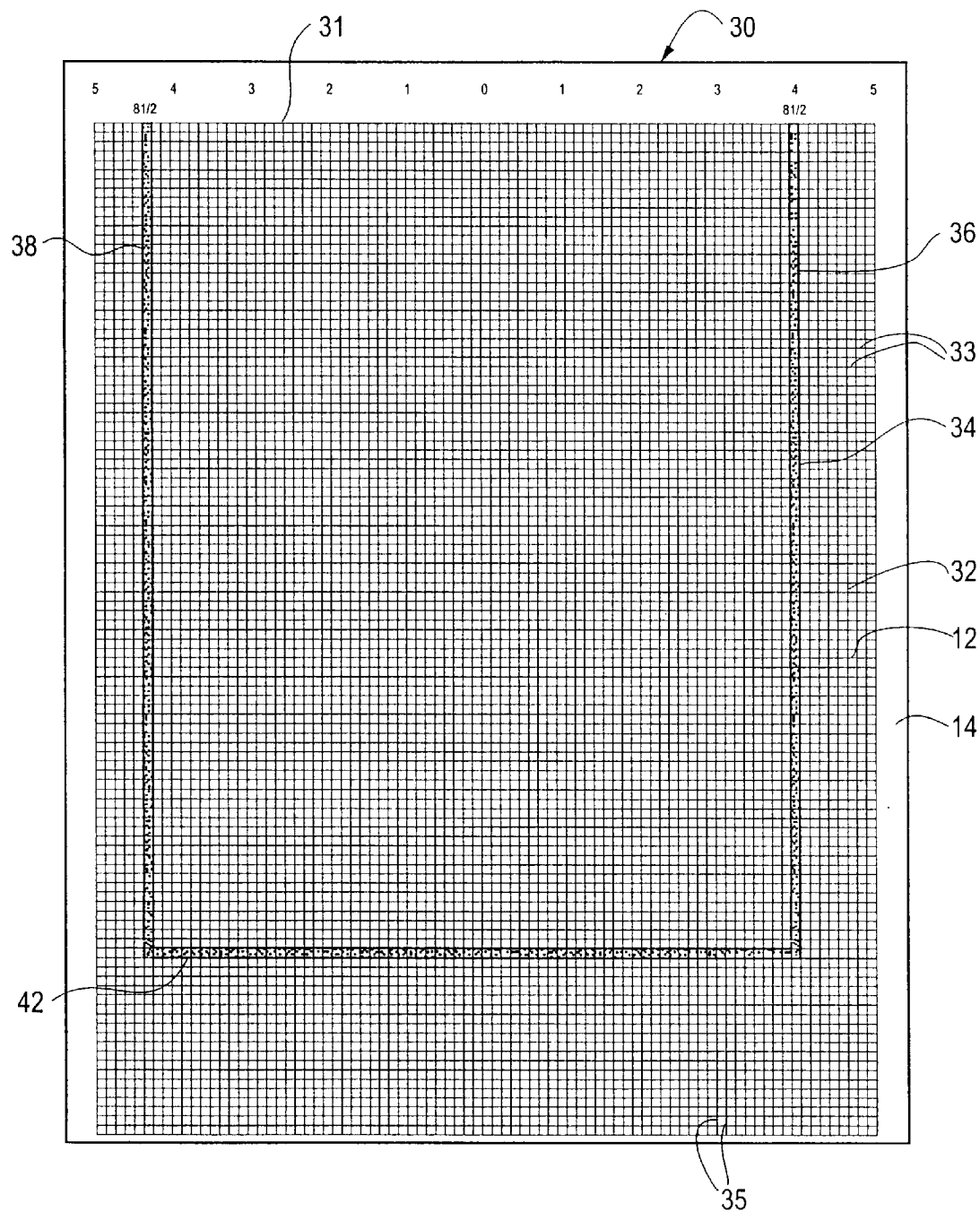
FIG. 2 is a plan view of another masking sheet in accordance with the present invention.

FIG. 2 shows a masking sheet 30 according to the present invention having an image area 12 and a border 14 as described above in reference to masking sheet 10 shown be FIG. 1. The masking sheet 30 further includes a grid 32 within the image area 12 having a plurality of horizontal grid lines 33, a plurality of vertical grid lines 35, and a boundary tint 34. The masking sheet 30 has 84 vertical grid lines 35 and 101 horizontal grid lines 33. Each vertical grid line 35 is ⅛" from the adjacent vertical grid lines 35 and each horizontal grid lines 33 is ⅛" from the adjacent horizontal grid lines 33.

The boundary tint 34 comprises opposed vertical tint lines 36 and 38 extending into the image area 12 from a horizontal boundary 31 of the grid 32 and a horizontal tint line 42 bounded by the tint lines 36 and 38 at a location within the image area 12. The tint lines 36, 38, and 42 are relatively wide, as compared to the grid lines 33 and 35, and are formed, as described below, to provide a tinted appearance within which the grid 18 that may be clearly identified.

The boundary tint 34 provides a guide for easily and repeatedly identifying the boundary of a standard sized region within the image area 12. For example, the vertical lines 36 and 38 of the masking sheet 30 are separated by an 8½" and the horizontal line 42 is located 11" from the horizontal boundary 31 of the grid 32 from which the lines 36 and 38 extend. The horizontal boundary 31 of the grid 32, the vertical lines 36 and 38 and the horizontal line 42 define a region that is 8½" by 11".

The masking sheet 30 is manufactured as described above in reference to masking sheet 10. The grid lines 33 and 35 are formed as are lines 24 and 26 of the grid 18. The boundary tint 34 is provided by including a conventional tint pattern within a desired region, such as the relatively wide tint lines 36, 38, and 42. A tint pattern is formed by dots that are sized and separated to appear as a tinted region. The boundary tint 34 is formed by a conventional tint pattern and is included in a master as described above. After the master including the grid 32 having the boundary tint 34 is created, the process of manufacturing the masking sheet 30 proceeds as described above by reference to masking sheet 10.

A masking sheet constructed as described herein has several advantages over conventional masking sheets. First, because the masking sheet is constructed from a polymeric material (preferably vinyl), it is more durable and reliable than paper masking sheets. Temperature and humidity changes do not cause the masking sheet to shrink or expand as can occur with paper masking sheets. As a result, the masking sheet can be reliably used at a later date to produce duplicate printing plates. The ⅛ grid is smaller than those traditionally provided on conventional masking sheets, making the masking sheet easier and more precise for the stripper and pressman to use. The vinyl is also more tear resistant than paper, and, as a result, registration holes formed in this material, will maintain their shape better than those formed in conventional sheets.

While particular elements, embodiments and applications of the present invention have been shown and described, it will be understood, of course, that the invention is not limited thereto since modifications may be made by those skilled in the art, particularly in light of the foregoing teachings.

What is claimed is:

1. A printing masking sheet comprising:
   a printer's grade vinyl masking sheet;
   the sheet being opaque to ultraviolet light and permeable to visible light;
   the sheet being sized to overlie a printing plate;
   the sheet including an image area sized to overlie a usable area of the printing plate and a border adjacent to the image area sized to overlie an unusable area of the printing plate;
   the image area defining an image face overlying the usable area of the printing plate;
   a grid overlying and adhered to the image face of the sheet;
   the grid being formed of a quick drying ink.

2. The printing masking sheet of claim 1 wherein the vinyl is orange.

3. The printing masking sheet of claim 1 wherein the vinyl is red.

4. The printing masking sheet of claim 1 wherein the grid is formed by a rubber based ink formulated for use in an offset printing press.

5. The printing masking sheet of claim 2 wherein the grid is formed by rubber based ink formulated for use in an offset printing press.

6. The printing masking sheet of claim 3 wherein the grid is formed by rubber based ink formulated for use in an offset printing press.

7. The printing masking sheet of claim 1 wherein the grid is formed by oil based ink formulated for use in an offset printing press.

8. The printing masking sheet of claim 2 wherein the grid is formed by oil based ink formulated for use in an offset printing press.

9. The printing masking sheet of claim 3 wherein the grid is formed by oil based ink formulated for use in an offset printing press.

* * * * *